(12) United States Patent
Zykin et al.

(10) Patent No.: US 9,240,538 B2
(45) Date of Patent: Jan. 19, 2016

(54) LED SPIRIT SYSTEM AND MANUFACTURING METHOD

(71) Applicants: Andrey Zykin, Getzville, NY (US); Alcinda Miller, Las Vegas, NV (US)

(72) Inventors: Andrey Zykin, Getzville, NY (US); Alcinda Miller, Las Vegas, NV (US)

( * ) Notice: Subject to any disclaimer, the term of this patent is extended or adjusted under 35 U.S.C. 154(b) by 0 days.

(21) Appl. No.: 14/076,682

(22) Filed: Nov. 11, 2013

(65) Prior Publication Data

US 2014/0131741 A1    May 15, 2014

Related U.S. Application Data

(60) Provisional application No. 61/725,191, filed on Nov. 12, 2012, provisional application No. 61/725,196, filed on Nov. 12, 2012, provisional application No. 61/737,422, filed on Dec. 14, 2012, provisional application No. 61/737,437, filed on Dec. 14, 2012, provisional application No. 61/737,459, filed on Dec. 14, 2012.

(51) Int. Cl.
*H01L 33/64* (2010.01)
*H01L 25/075* (2006.01)
*H01L 33/62* (2010.01)

(52) U.S. Cl.
CPC .......... *H01L 33/647* (2013.01); *H01L 25/0753* (2013.01); *H01L 33/62* (2013.01); *H01L 2224/48091* (2013.01); *H01L 2224/48137* (2013.01)

(58) Field of Classification Search
CPC ....... H01L 33/50; H01L 33/647; H01L 33/62; H01L 25/0753; H01L 2224/48091; H01L 2224/48137; F21K 2/00; C09K 11/00; F21V 9/00; F21V 9/16
See application file for complete search history.

(56) References Cited

U.S. PATENT DOCUMENTS 7,714,346 B2 * 5/2010 Ogawa et al. .................. 257/99
2005/0127833 A1 * 6/2005 Tieszen ......................... 313/512

* cited by examiner

*Primary Examiner* — Bao Q Truong
(74) *Attorney, Agent, or Firm* — Luis Figarella

(57) ABSTRACT

The present invention relates to a new method, system and apparatus for light emitting diode (LED) packages. An object of the present invention is to provide an LED package having reduced components, a superior heat dissipation property and a compact structure, does not largely restrict use of conventional equipment for its manufacture, and is compatible with implementation within present illumination devices packaging.

19 Claims, 21 Drawing Sheets

Prior Art

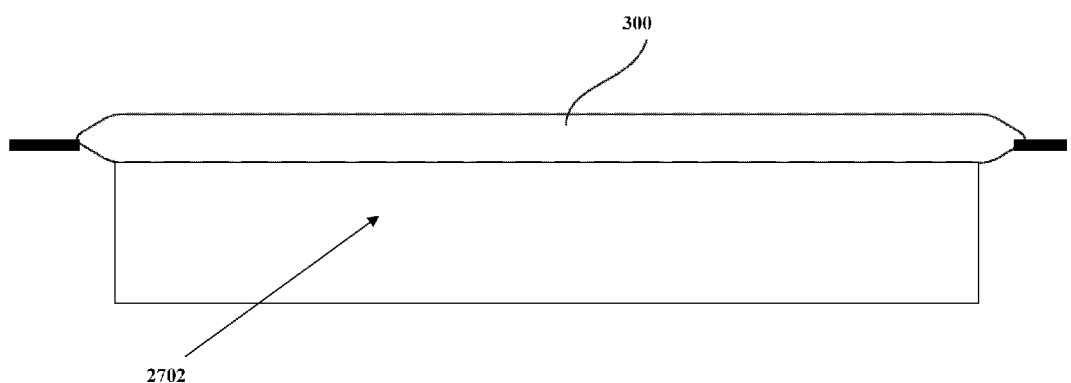
Figure 31
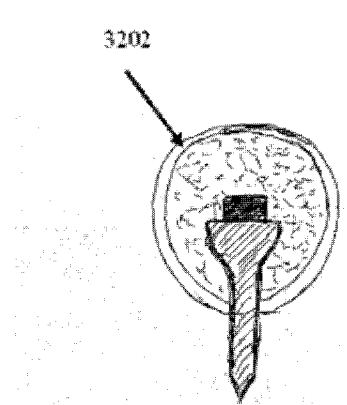 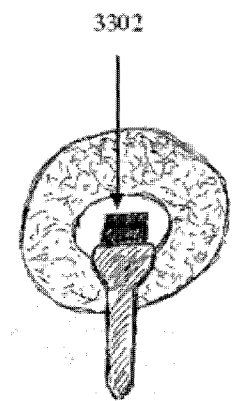
Figure 32          Figure 33

LED SPIRIT SYSTEM AND MANUFACTURING METHOD

CROSS-REFERENCE TO RELATED APPLICATIONS

This application claims priority to U.S. Provisional patent application Ser. No. 61/725,191 titled "LED Spirit System", filed on Nov. 12, 2012 the disclosure of which is herein incorporated by reference in its entirety, U.S. Provisional patent application Ser. No. 61/725,196 titled "LED Spirit Connector System", filed on Nov. 12, 2012, U.S. Provisional patent application Ser. No. 61/737,422 titled "LED Stick, Strings, Straw and/or Chain Manufacturing Method", filed on Dec. 14, 2012, U.S. Provisional patent application Ser. No. 61/737,437 titled "LED Fluid Cooling Assembly", filed on Dec. 14, 2012, and U.S. Provisional patent application Ser. No. 61/737,459 titled "LED Stick, Strings, Straw and/or Chain Phosphor Coating System and Method" filed on Dec. 14, 2012.

PATENTS CITED

The following documents and references are incorporated by reference in their entirety, Ogawa et al (U.S. Pat. No. 7,714,346), Kang et al (U.S. Pat. No. 7,642,563), Mok et al (U.S. Pat. No. 7,262,438), Zykin (U.S. patent application Ser. No. 13/313,129), Li (U.S. Pat. Appl. No. 2011/0261563) and Vilella (EP 1032912).

FIELD OF THE INVENTION

The present invention relates to a method for manufacturing Light Emitting Diodes (LEDs) sticks, candles, strings or straws from a surface, and in particular to a method for the high-yield, efficient and inexpensive manufacture of LED sticks.

DESCRIPTION OF THE RELATED ART

LEDs promise to revolutionize illumination, through their ultra efficient conversion of energy into visible light. Within a decade, we have gone from illumination provided by a 60 W incandescent light bulb being replaced by a 13 W Compact Fluorescent Light bulb (CFL) to a 3 W LED light bulb. In effect, reducing by over 90% the consumption required for similar illumination. The above is not only important because it saves energy, but also because now we can illuminate the world without the need to electrify the world.

An LED is an element in which electrons and holes are combined in a P-N semiconductor junction structure by application of current thereby emitting certain types of light. LEDs are typically formed to have a package structure, in which an LED chip is mounted on a mechanical carrier, frequently referred to as an "LED package." Such an LED package is generally mounted on a printed circuit board (PCB) and receives current applied from electrodes formed on the PCB to thereby emit light.

In general illumination applications, engineers have discovered the importance of generating light in a 360 deg. envelope, not unlike the way in which an incandescent filament illuminates. To accomplish such goals, a new type of package termed an LED sticks or LED straw has been created. In it, individual LEDs are serially placed along a thin sleeve or slice of material, typically made of a sapphire or ceramic material. The stick is powered from each end, creating a stick of light.

In an LED package, heat generated from the LED chip has a direct influence on the light emitting performance and life span of the LED package. When heat generated from the LED chip is not effectively removed, dislocation and mismatch occur in a crystal structure of the LED chip. In effect, brightness is related to power applied, so a large amount of heat is generated in an LED chip due to the high currents, heat that must be typically transferred to a heat sink, typically, a separate device for effectively dissipating the generated heat is required.

Presently, LED units are manufacture by placing individual packaged LEDs in the stick. Unfortunately, the stresses of placing these with a 'chip-shooter', wire bonding the individual LEDs to each other cause significant stresses to the package, resulting in low yields. In addition to the above, LED string packages from which white light is desired, must receive a coating of yellowing phosphor in order to emit "white" light. Such a coating is hard to apply to an elongated structure such as an LED string.

What is needed is a way in which to attach LED packages to LED strips, strings or slices that preserves high yields and allows for good yellow phosphor attachment.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

In one aspect, the invention is about an LED light package system comprising a single one or more LED die chips placed on one or more adjoining LED frames, each said LED die chip connected electrically to the LED die chip before and after forming an electrical LED chain, and said one or more LED frames encapsulated within a single solid enclosure, said enclosure having access to its interior via electrical connections to the initial LED package located at said chain near end, and to the final LED package located at said chain distal end, said electrical connections being suitable for connection to a power source. In another aspect, the said one or more LED frames are formed of metal. In yet another aspect, said LED light package is connected to one or more other LED light packages serially or in parallel to form an assembly of light sources. In another aspect, said assembly of light sources is enclosed within a lamp or bulb. In yet another aspect one or more said enclosure is surrounded by a coating of appropriate yellow phosphor material. In another aspect, one or more said enclosure is surrounded by a heat-activated sleeve coated with the appropriate yellow phosphor material. In yet another aspect, said assembly of light sources is enclosed within a tube.

In one aspect, said one or more metal LED frames extend outside the encapsulation volume forming one or more fins. In another aspect, said assembly of light sources is enclosed within a lamp or bulb, and one or more said enclosure is surrounded by a coating of appropriate yellow phosphor material. In another aspect, said assembly of light sources is enclosed within a lamp or bulb and one or more said LED light package enclosures is surrounded by a heat-activated sleeve coated with the appropriate yellow phosphor material. In yet another aspect, said assembly of light sources is enclosed within a tube. In another aspect, said fins are shaped to provide mechanical support within said tube, and one or more said enclosure is surrounded by a coating of appropriate yellow phosphor material. In another aspect, one or more said LED light package enclosures is surrounded by a heat-activated sleeve coated with the appropriate yellow phosphor material. In one aspect, one or more of the above encapsulation are enclosed within a fluid-filled container.

In one aspect, said one or more LED frames are formed of a sapphire or sapphire-like material. In another aspect, said LED light package is connected to one or more other LED light packages serially or in parallel to form an assembly of light sources. In yet another aspect said assembly of light sources is enclosed within a lamp or bulb and one or more said enclosure is surrounded by a coating of appropriate yellow phosphor material. In another aspect, said assembly of light sources is enclosed within a lamp or bulb and one or more said enclosure is surrounded by a heat-activated sleeve coated with the appropriate yellow phosphor material. In another aspect, one or more of said encapsulations are enclosed within a fluid-filled container.

In one aspect, the invention is about a method for manufacturing an LED light source system, said method comprising, placing one or more LED die chips on one or more adjoining LED frames, connecting each said LED die chip electrically to the LED die chip before and after said LED die chip, encapsulating said one or more LED frames within a single solid enclosure, allowing an electrical connection to the interior of said enclosure to connect to the initial LED package located at said chain near end, and to the final LED package located at said chain distal end.

In one aspect, the invention is about a method for manufacturing an LED light source system, said method comprising placing one or more LED die chips along rows on an area wafer, connecting each said LED die chip electrically to the LED die chip before and after said LED die chip within a particular row, separating each individual row of LED die chips into an individual sliver, encapsulating one or more said slivers within a single solid enclosure, allowing an electrical connection to the interior of said enclosure to connect to the initial LED package located at said chain near end, and to the final LED package located at said chain distal end.

Other features and advantages of the present invention will become apparent upon examining the following detailed description of an embodiment thereof, taken in conjunction with the attached drawings.

BRIEF DESCRIPTION OF THE DRAWINGS

FIGS. 13-35 show various illustrations of improved mechanical/electrical/heat dissipation options, according to exemplary embodiments of the invention.

Figure 1A:
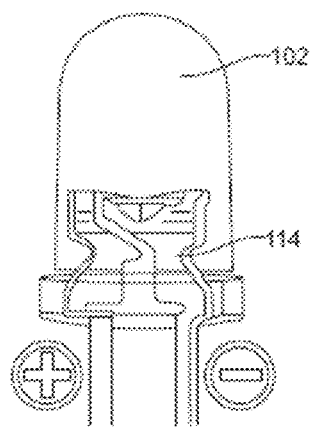
FIGS. 1A-1C show illustrations of prior art related to traditional LED mfg. techniques.

The above-described and other features will be appreciated and understood by those skilled in the art from the following detailed description, drawings, and appended claims.

DETAILED DESCRIPTION OF THE PREFERRED EMBODIMENT

To provide an overall understanding of the invention, certain illustrative embodiments and examples will now be described. However, it will be understood by one of ordinary skill in the art that the same or equivalent functions and sequences may be accomplished by different embodiments that are also intended to be encompassed within the spirit and scope of the disclosure. The compositions, apparatuses, systems and/or methods described herein may be adapted and modified as is appropriate for the application being addressed and that those described herein may be employed in other suitable applications, and that such other additions and modifications will not depart from the scope hereof.

Simplifications or omissions may be made to avoid obscuring the purpose of the section. Such simplifications or omissions are not intended to limit the scope of the present invention. All references, including any patents or patent applications cited in this specification are hereby incorporated by reference. No admission is made that any reference constitutes prior art. The discussion of the references states what their authors assert, and the applicants reserve the right to challenge the accuracy and pertinence of the cited documents. It will be clearly understood that, although a number of prior art publications are referred to herein, this reference does not constitute an admission that any of these documents form part of the common general knowledge in the art.

As used in the specification and claims, the singular forms "a", "an" and "the" include plural references unless the context clearly dictates otherwise. For example, the term "a transaction" may include a plurality of transaction unless the context clearly dictates otherwise. As used in the specification and claims, singular names or types referenced include variations within the family of said name unless the context clearly dictates otherwise.

Certain terminology is used in the following description for convenience only and is not limiting. The words "lower," "upper," "bottom," "top," "front," "back," "left," "right" and "sides" designate directions in the drawings to which reference is made, but are not limiting with respect to the orientation in which the modules or any assembly of them may be used.

It is acknowledged that the term 'comprise' may, under varying jurisdictions, be attributed with either an exclusive or an inclusive meaning. For the purpose of this specification, and unless otherwise noted, the term 'comprise' shall have an inclusive meaning—i.e. that it will be taken to mean an inclusion of not only the listed components it directly references, but also other non-specified components or elements. This rationale will also be used when the term 'comprised' or 'comprising' is used in relation to one or more steps in a method or process.

Figure 1B:
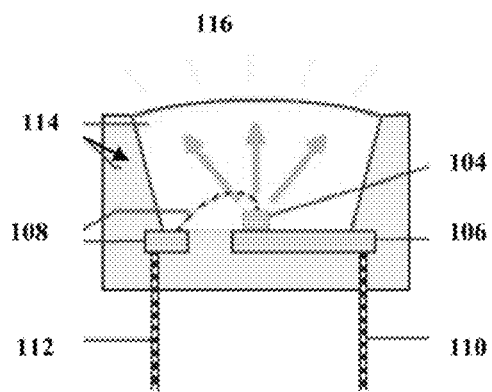
Figure 1C:
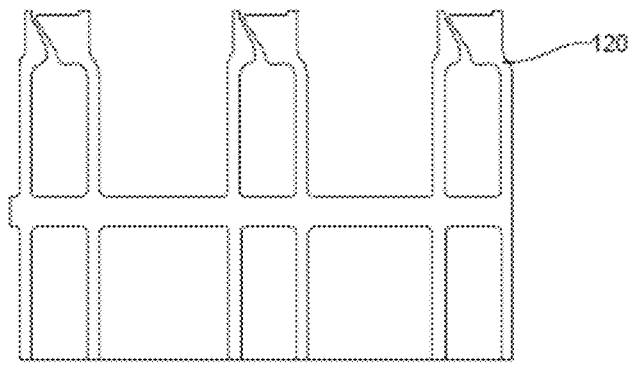

Referring to FIGS. 1A-1C, we illustrate the basic lensed light emitting diode (LED) 102 structure and its fabrication by placing the LED Die chip 104 on a lead frame 106 connected to a cathode (−ve) 1102 and wire bonding it to another lead frame 108 connected to an anode (+ve) 110, encapsulating the complete assembly in clear or colored epoxy 114, resulting in light output 116.

Figure 2:
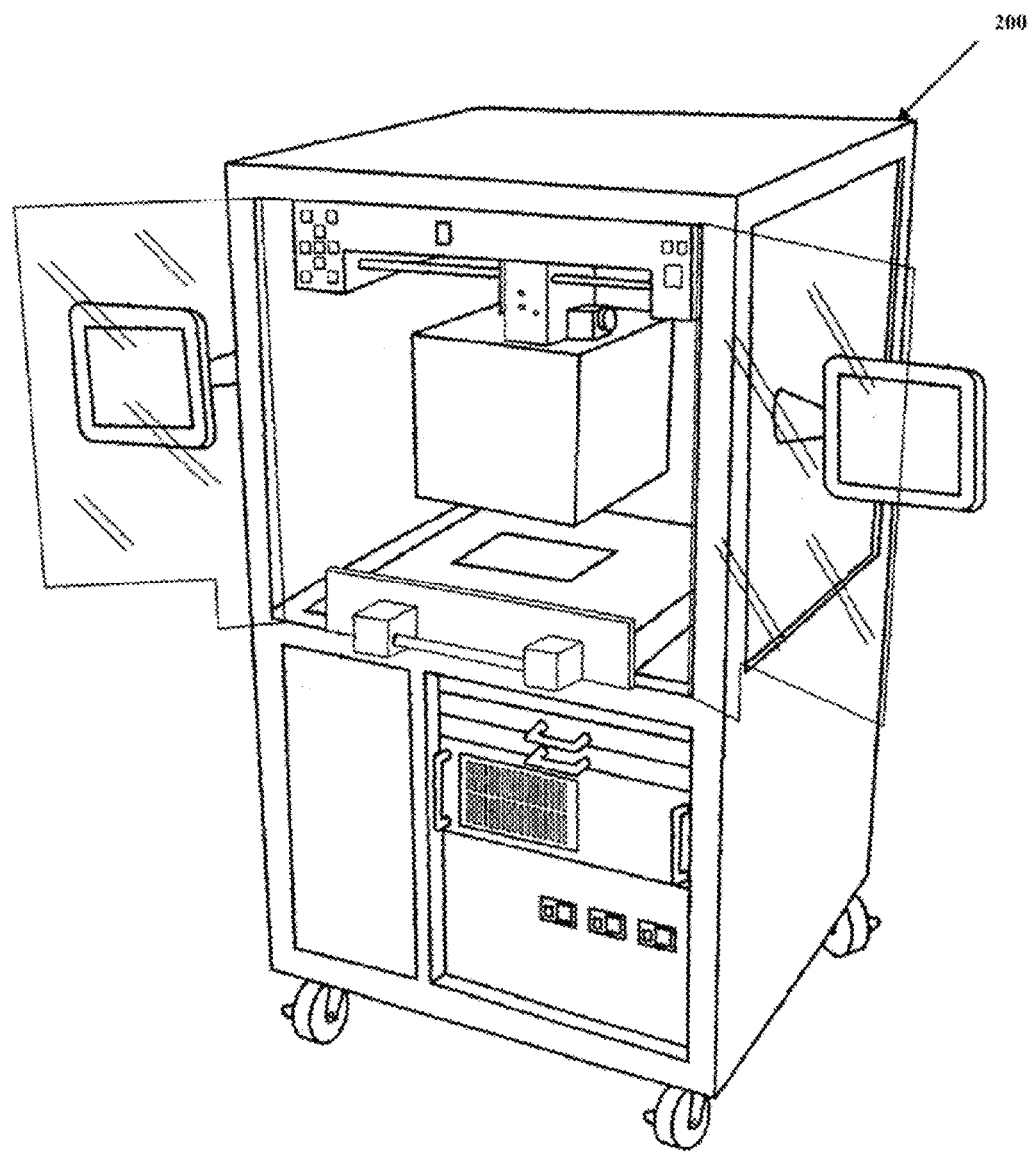
FIG. 2 illustrates a chip-shooter machine, according to prior art.
Figure 3A:
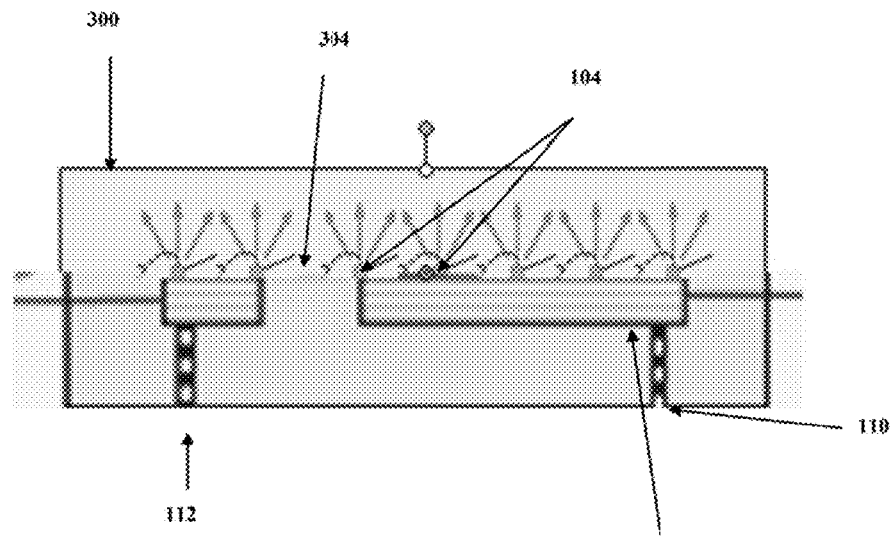
FIGS. 3A-3F, 4-12 show illustrations of the improved LED mechanical/electrical packaging options and mfg. methods, according to exemplary embodiments of the invention.
Figure 3B:
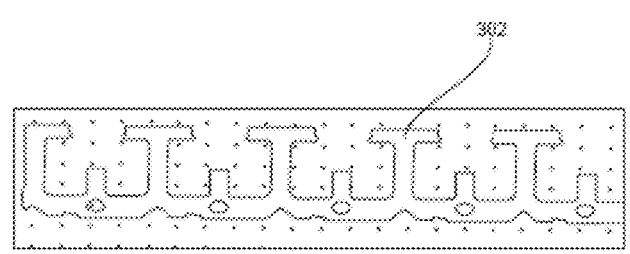
Figure 3C:
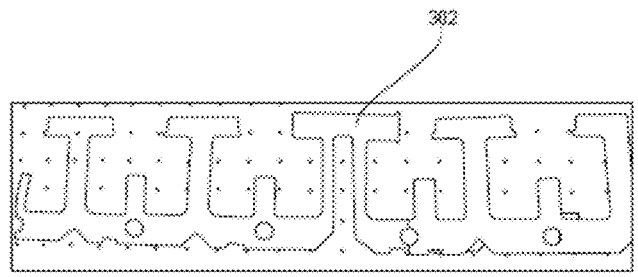
Figure 3D:
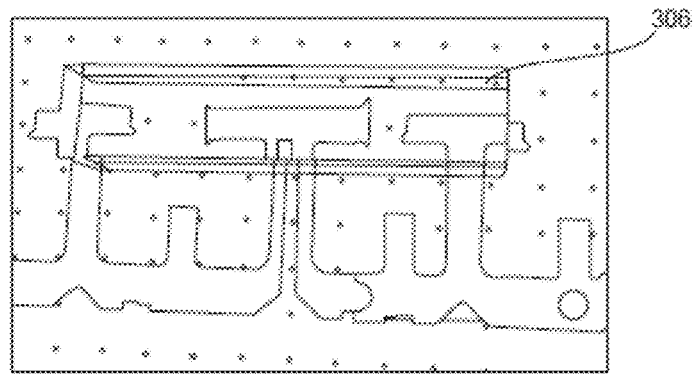
Figure 3E:
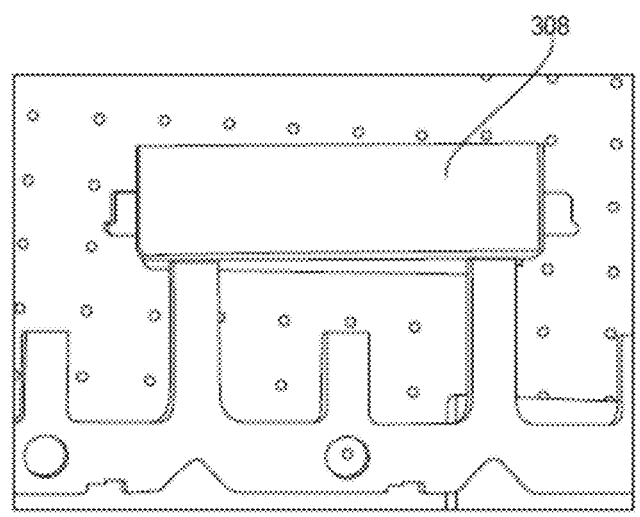
Figure 3F:
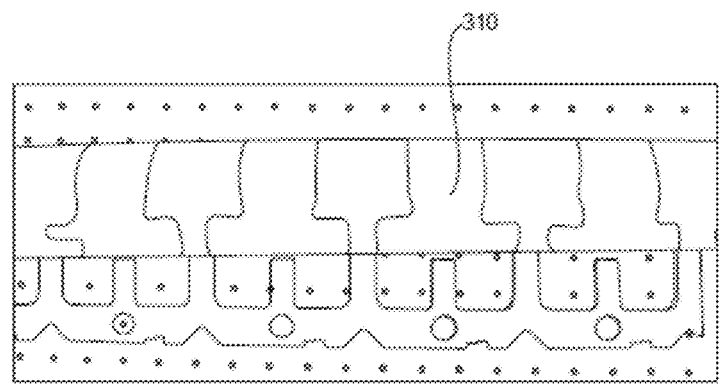

All of the above is usually done by a placement and wire/bonder onto a metal frame 120, with the finished product then residing in a plastic LED package. The packaged semiconductors such as LED assemblies are traditionally placed on an plastic frame, FR4 laminate or similar material board with a chip placement machine 200, usually called a 'chip shooter' (FIG. 2).

The above may be improved FIGS. 3A-3E by creating an LED candle, strings, straw, chain and/or LED stick 300 by redesigning the metal frame 120 so that the "flat" area of the frame 302 to place the individual LED die chip 104 is extended and becomes longer. In addition, the design may span two or more frames 302 on a thin shaped substrate, so that two or more LED die chips 104 can be placed and sequentially wire bonded (even spanning the gap space 304 between frames 302).

In one embodiment, one or more LED die chips 104 may be placed in or on each LED frame bar 302, by placing four or more LED dies or chips 104 on top of the bars or frames 302. After expansion, the bars now can accommodate many more of the LED dies, chips or crystals. In one embodiment, the actual LED dies 104 may be of different colors, to naturally correct the Color Temperature Reflectance (or CIR) of the light coming off the complete assembly.

Note the above means that the LED chips within the top of the concatenated bars may be hundreds, and could be a combination of colors. In addition to LED chips, other semiconductors may be placed atop the bar, including other diodes, transistors, electro-static protection elements (resistors, etc.), resistors, capacitors and many other electronic components. This placement may be automated or manual, and connected together via traditional methods such as wire bonding, soldering, etc.

Once the appropriate electronic components are placed, the complete assembly may be encapsulated within a material. This process may be accomplished using injection molding in any preferred orientation. The injection molded material may be clear 306, or any other suitable colored desired 308, including using Phosphor filled plastic injection 310. The complete entity looks eerily like a candle or LED stick of concatenated individually glowing LED sections, being powered from one end to the other and/or after a number of units.

Power dissipation is accomplished by the encapsulation material as well as by the extensions of the LED frames outside the encapsulation, which then act as a radiator for the heat. Besides cylindrical shapes, other shapes may be used, including square, rectangular, triangular, etc. Adding one or more of the units within an enclosure creates an Omni directional LED assembly that behaves optically eerily like an incandescent bulb filament.

The user may elect the shape of the plastic or other material covering the LEDs, such as a long bar covering all LED chips and parts of Cathode(s) and Anode(s). If needed, almost finished Lead Frame may be Phosphor coated, with silicone or other based Phosphor. It could be coated by using immersion, electrostatic coating and any other suitable methods. After finishing encapsulation and coating the lead frame goes to a cutting machine. That machine cuts off not needed anymore technological holders like holders, supports, bases, extra length of anode and cathodes, etc.

Figure 4:
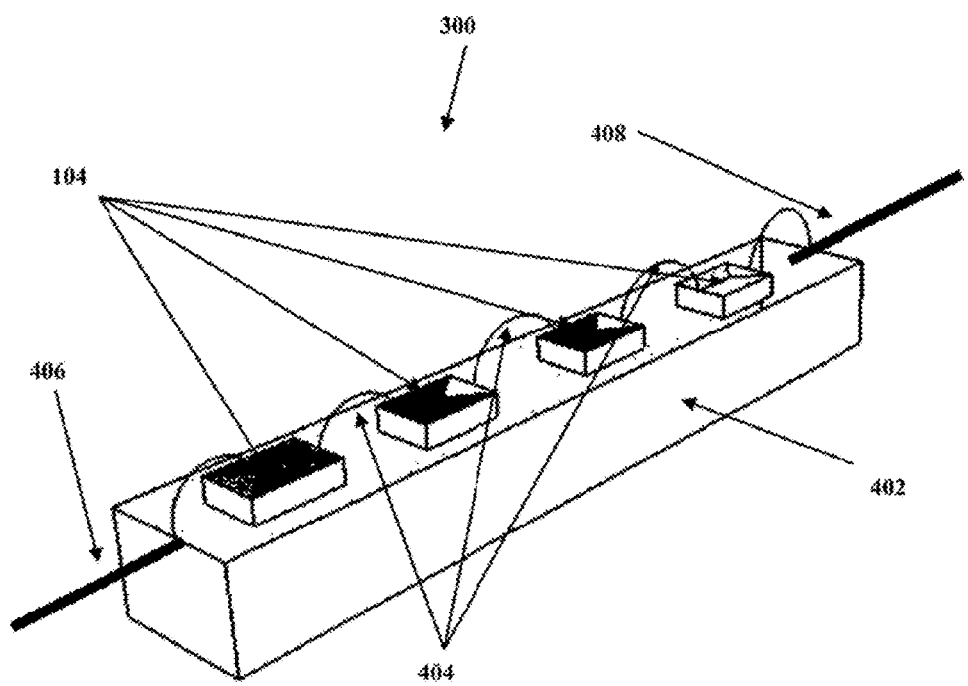
Figure 5:
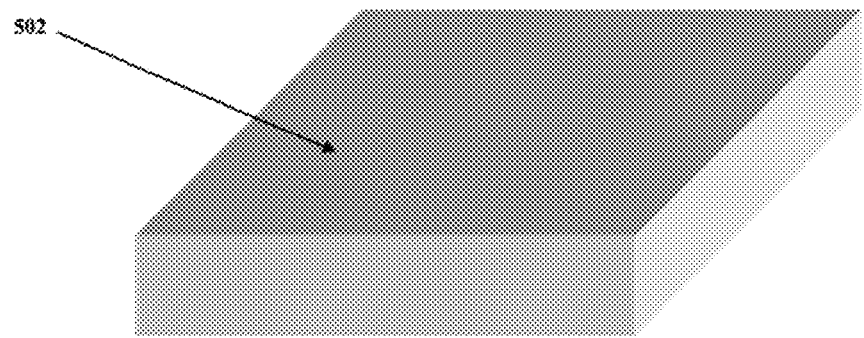
Figure 6:
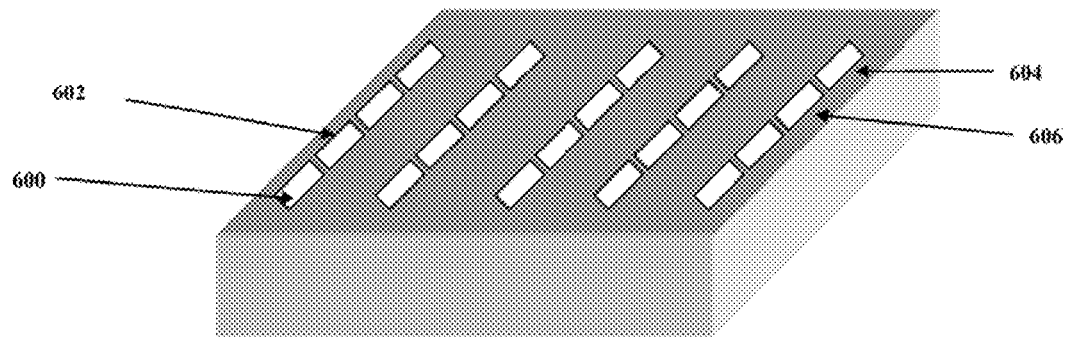
Figure 7:
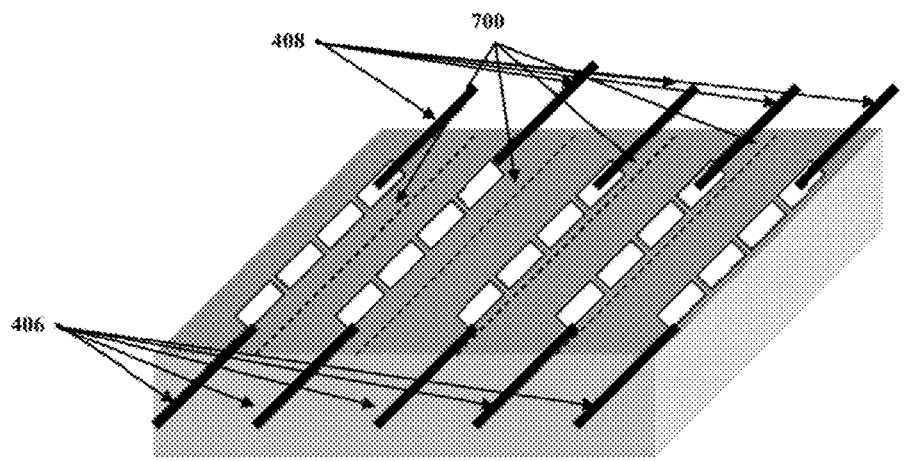
Figure 8:
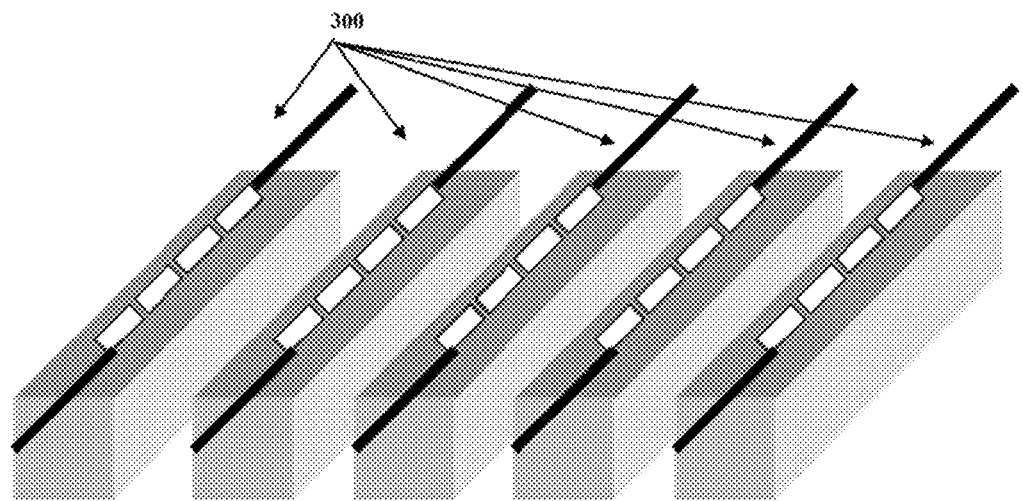
Figure 9:
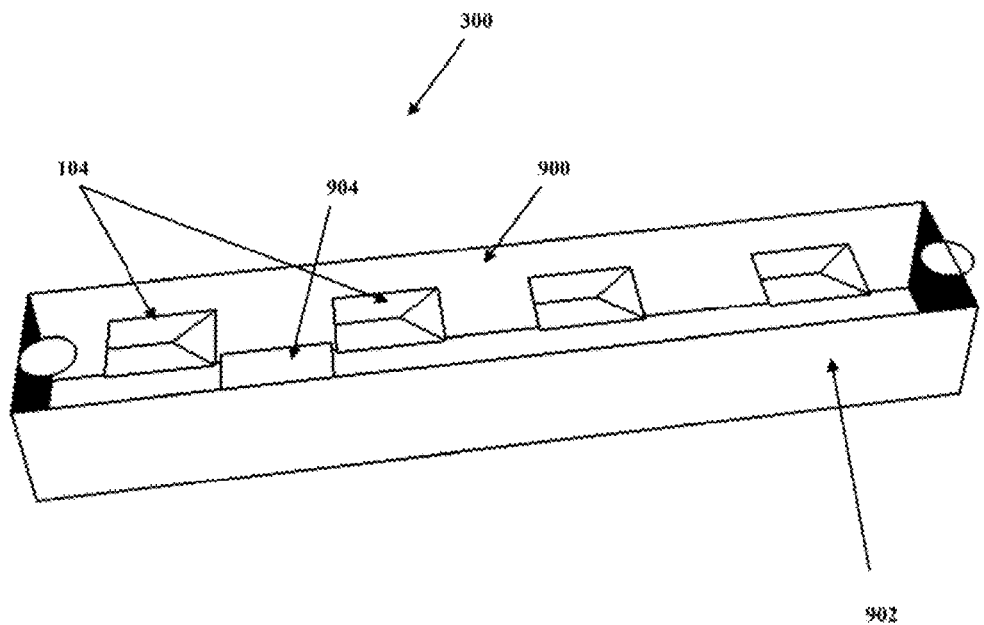
Figure 10:
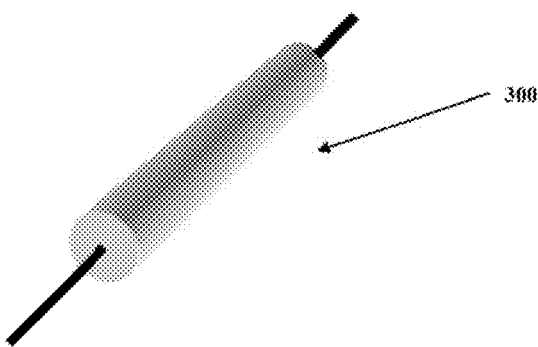

In one embodiment, sapphire-type substrates are preferred over metal, in particular because they allow some of the light to filter around their body, providing the stick with light behavior closer to that of an incandescent filament. Referring to FIG. 4, we see the internal structure 400 of such a light stick 300. An elongated sliver 402 of material has two or more LEDs packages die chips 104 bonded to the surface of one side of said slivers 402.

The LED packages dies 104 are then connected to each other electrically. In one embodiment, this may be done via wire bonding 404 each die to the next, as well as to the entry 406 and exit 408 anode and cathode wires. In an alternate embodiment, the exit/entry wires (406, 408) may be made as a solid metal cover and later sliced within a solid sheet, solid block and/or lead frame into separate pieces. These entry/exit wires are usually extended outside any encapsulation or cover package features.

The above LED stick package 300 is then enclosed or encapsulated in clear silicone or similar material, dipped in yellow phosphor and tested. Other colors may be selected for the encapsulation. Note that while in one embodiment the individual LED dies 104 may be comprised of "white light" LEDs, a particular LED stick 300 may be comprised of any desired combination of RED, GREEN, BLUE (and any other customized colors) individual LEDs.

Unfortunately, because the above process is performed on a sliver 402 of material by a machine traditionally used to deal with an area device or area wafer, many potential failure points are introduced. Holding a sliver is hard and problematic, pushing on it by either the wire bonder, the chip shooter or any other number of parts creates structural stress and/or failure points. In addition, the wire bonder may need to heat the ends, and that heat will be transferred to the sliver in a non-uniform way. In short, a lot of parts are found to be defective or non-working, resulting in a low yield of useful parts.

In contrast, the applicant's new inventive design and fabrication method (FIGS. 5-10) begins by mounting the LEDs chips 104 on the complete sapphire or sapphire-like material board or other suitable area wafer 502 before it is sliced into individual slivers 300. The advantages of using this method are many. The chip shooter is already tooled for holding FR4 laminate boards, and any heat generated by the wire bonder is spread not only into the sliver 300 area, but also to the adjacent neighbor structures. This step is critical, since programming of the wire bonder would allow for the machine to work on other areas (say first bonding LEDs 104 (individually LEDs 600 to 602, followed by 604 to 606)). Such a spreading of the heat would provide less heat stress to the wafer 502 area forming part of the first stick.

Note that while we mention sapphire, in an alternate embodiment Germanium, Silicon, FR4, plastic and or any other material may be used for the wafer 502. Similarly, instead of wire bonds, the connections between the LEDs 104 may be sputtered, ion deposited or any other suitable way to lay a conductive layer and LED mounting pads on the board 502 surface.

In one embodiment, next we lay and connect the LEDs 104 within the board 502 using the area that will in the end form the sliver, performing any force stress, thermal stress and/or other action while the slivers are still forming a solid board. In some embodiments, we excoriate, score, laser etch or mechanically grind the fracture, breakage or separation lines 700 (in a fashion similar to that used when preparing glass for breakage or separation into portions) before laying and attaching the LEDs 104. This has the advantage of providing the ability to clean any leftovers from that operation before gluing or depositing the LEDs. This may be needed in some embodiments to clear/smooth the surface of the edges.

In an alternate embodiment, said scoring between slivers 300 is performed later. Note the lines 700 may be surface driven or significantly go into the board/wafer 502, as long as the unit behaves as a larger area, and not as a sliver (i.e. a thin stick vs. a board), the benefits above will be present. As a next step, the slivers 402 are formed by separating the board 502 into components, creating fully functional LED strip subassemblies 300 that have the input/output wires and are only lacking the subsequent steps of encapsulation).

This process may be accomplished using injection molding in any preferred orientation. The injection molded material may be clear, or any other suitable colored desired, including using Phosphor filled plastic injection. In alternate embodiments the phosphor is added later, producing a partial LED Stick 300 that only lacks the appropriate color output. In one embodiment, said partial LED stick 300 is a sliced sliver or thin strip having a series of crystals glued or affixed to them.

In an alternate embodiment (FIG. 9) the light output from the LED strip subassembly 300 may be doubled and/or increased by placing LEDs 104 on the top 900 surface as well as on the opposite (or bottom) 902 side of the board before cutting. The LEDs on the bottom may be optimally placed in a checkerboard or staggered patter 904 (so that their bottoms do not block any side lobe or residual light travelling across the sliver 402, or they may be placed opposite of each other. Note the LEDs 904 on the bottom are placed so the light emits away from the sliver 402.

The complete entity looks eerily like a column, candle or LED stick 300 of concatenated individually glowing LED sections, being powered from one end to the other. Power dissipation is accomplished by the encapsulation material and or the LED frame inside the encapsulation, which acts as a radiator of heat. While in the embodiment shown the LED stick is cylindrical, other shapes may be accomplished depending on the encapsulation used, including triangular, etc.

In one embodiment, the encapsulating LED stick 300 plastic is defined as electrically conductive plastic. In an alternate embodiment, it is possible to use a polycarbonate. Polycarbonates (PC), known by the trademarked names Lean, Maroon, Marcela and others, are a particular group of thermoplastic polymers. They are easily worked, molded, and thermoformed. Because of these properties, polycarbonates find many applications. Polycarbonates do not have a unique resin identification code.

In an alternate embodiment, it is possible to use a polycarbonate. Polycarbonates (PC), known by the trademarked names Lean, Maroon, Marcela and others, are a particular group of thermoplastic polymers. They are easily worked, molded, and thermoformed. Because of these properties, polycarbonates find many applications. Polycarbonates do not have a unique resin identification code.

Most "white" LEDs use a 450 nm-470 nm blue GaN (gallium nitride) LED covered by a yellowish phosphor coating usually made of cerium doped yttrium aluminum garnet (YAG:Ce) crystals which have been powdered and bound in a type of viscous adhesive. The LED chip emits blue light, part of which is converted to yellow by the YAG:Ce. The single crystal form of YAG:Ce is actually considered a scintillator rather than a phosphor. Since yellow light stimulates the red and green receptors of the eye, the resulting mix of blue and yellow light gives the appearance of white.

Such a dye may be painted onto the stick surface, or the stick may be dipped onto the dye. The injection molded material may be clear, or any other suitable colored desired, including using Phosphor filled plastic injection. In alternate embodiments the phosphor is added later, producing a partial LED Stick 300 that only lacks the appropriate color output.

In either case, if the stick 300 is simply used as embodied above, the heat generated becomes hard to remove, resulting in packages that typically do not exceed the 0.8 Watts per stick, lest permanent damage may occur to the LED components 104, electrical bonds (404), or sliver 402.

Applying the cerium or similar phosphor coating to either the LED stick 300 or any container enclosing the LED stick is complicated by the time required to either paint and dry, or the tendency of any dipping to generate gravity fed drooping of the coating. One possible improvement would be to generate cylinder or tube-shaped sheets of the phosphor coating using shrink wrap heat-activated material 1102, similar to that used for wire wrapping.

Figure 11:
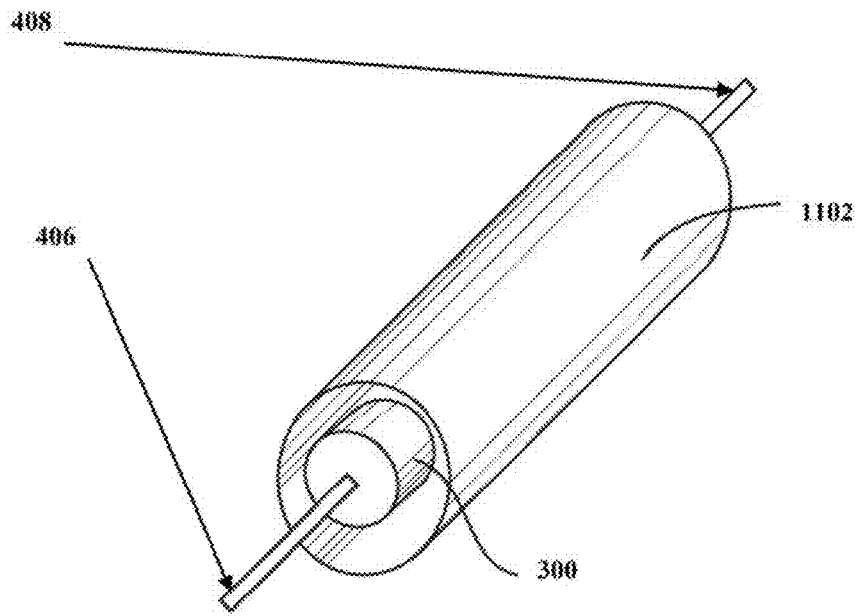
Figure 12:
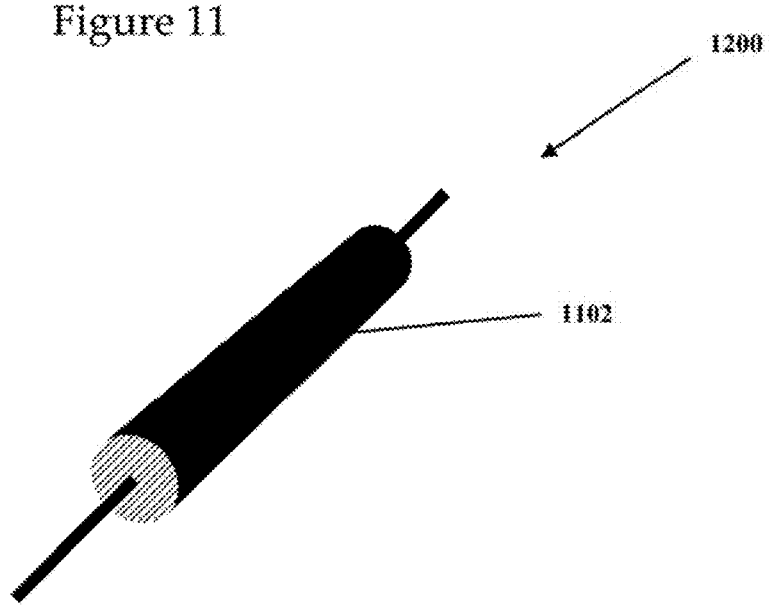

Referring to FIGS. 11-12, material like this could be coated or impregnated with the appropriate yellow phosphor, placed over the LED stick 300 and heated so that it shrinks and produces a complete and uniform yellow phosphor coated LED light stick 1200 around the original colored LED stick 300, resulting in light emission characteristics that are uniform.

By creating a cylinder or tube-shaped sheet of the cerium or similar phosphor coating, laid on an optical quality and/or transparent shrink wrap heat-activated material. Such a heat activated shrink wrap could be similar to that used for wrapping parcels, and would behave similar to the tubes used for wire wrapping. A material like this could be coated with the appropriate yellow phosphor, placed over the uncoated LED stick and heated so that it shrinks and produces a complete yellow phosphor coated LED stick with light emission characteristics that are uniform in the desired wavelength.

Figure 13:
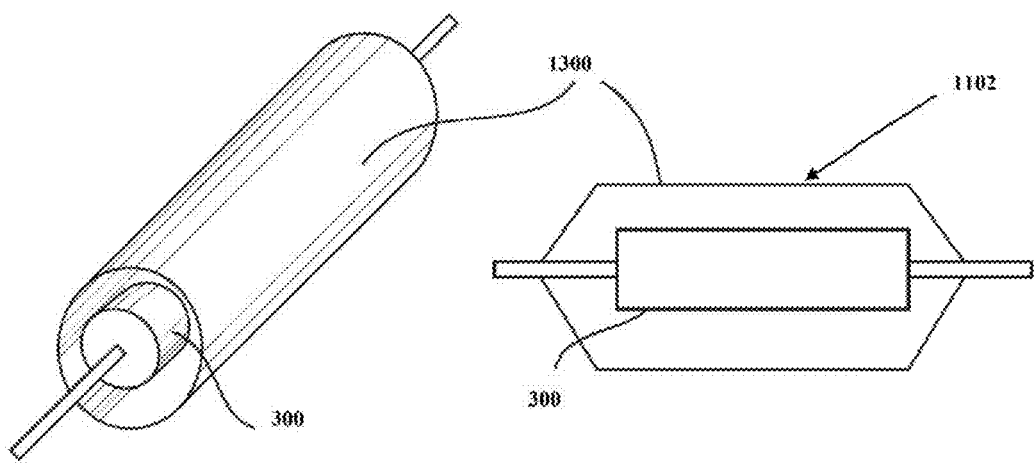
Figure 14:
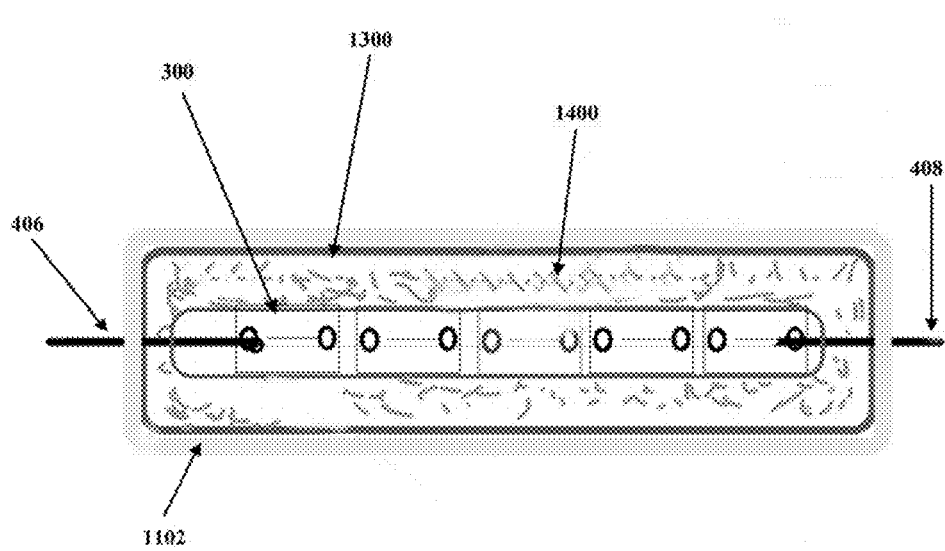
Figure 15:
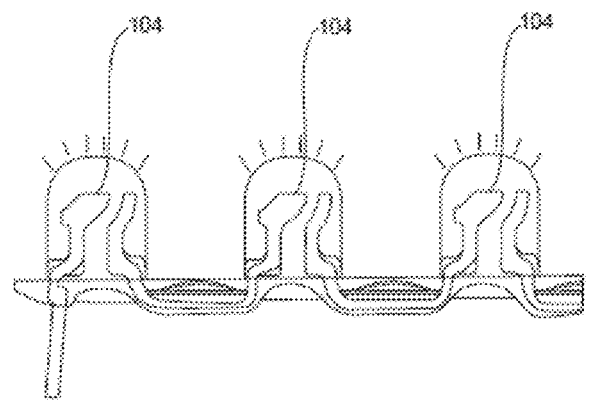
Figure 16:
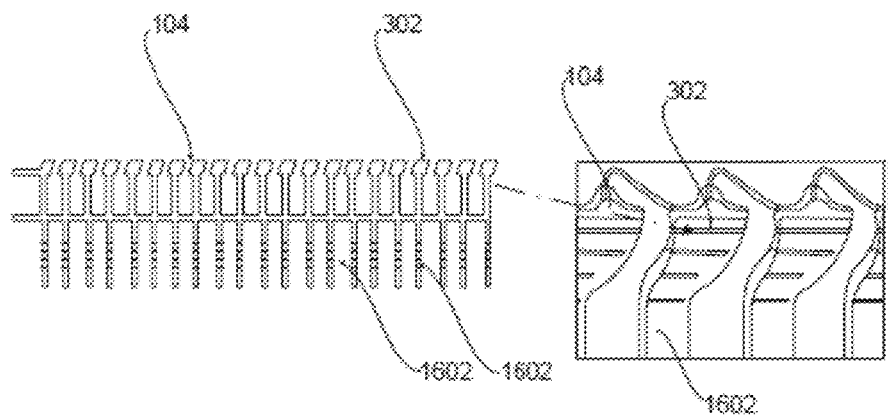
Figure 17:
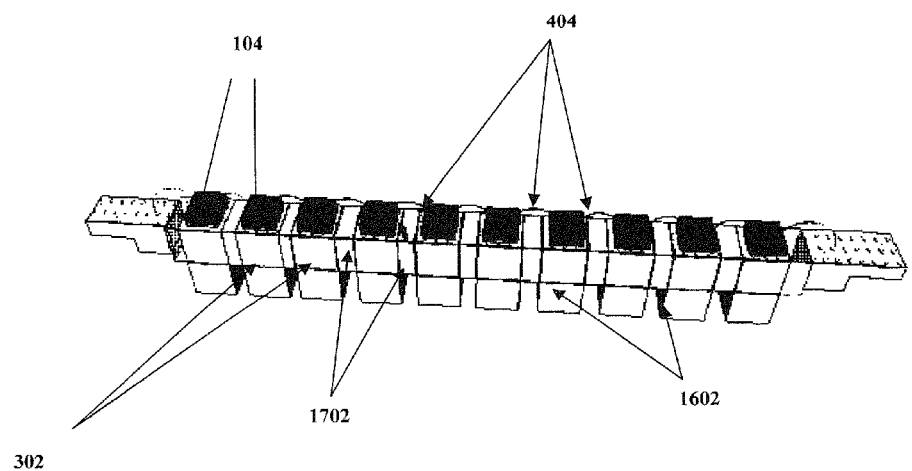
Figure 18:
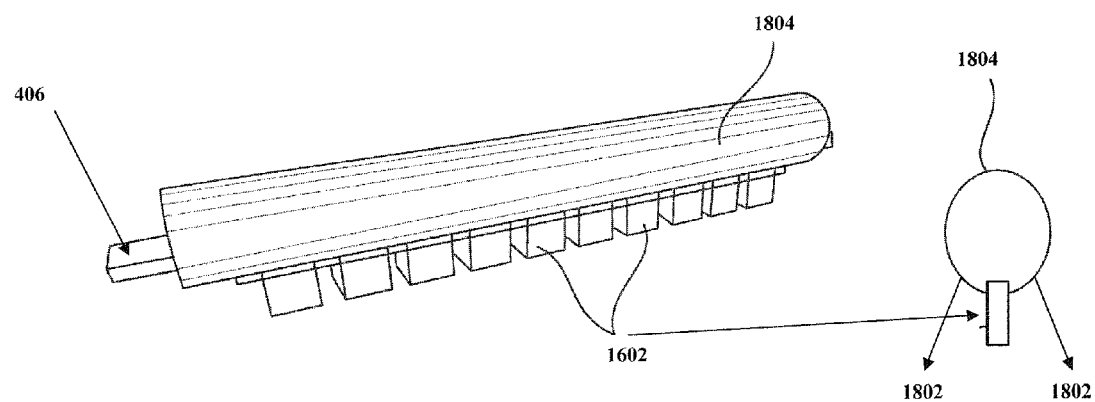

To increase this power output (FIGS. 13-14 and 35), in some applications, users have opted to package the LED sticks 300 inside a bulb 3502 or tube 1300, reminiscent of how incandescent filaments are inside a vacuum bulb, then filling the inside volume with a fluid having better heat transmission properties than air (such as an dielectric liquid). In such cases, the resulting bulb is significantly heavier, and may leak when placed 'connector down' (as is the case in most lamps). In addition, the liquid inside a bulb has an optical path that is farther around the equator of the bulb than around the top, resulting in a distorted optical path for the light.

In a similar embodiment, a container could house a clear LED stick 300 or chain of LEDs sticks 300 (say long enough to fit a fluorescent tube) could be packaged inside an overlaying container 1300, creating a sealed chamber 1400 that encloses said LED stick 300 or assembly, then filled with a fluid. In one embodiment, said container 1300 creates the sealed chamber 1400 having a significantly cylindrical cross section, so that the distance travelled by the light from the LEDs to the walls is significantly uniform, but other shapes may be employed, such as two sided envelopes, triangles, hexagons, octagons, ellipses, etc. In one embodiment, the diameter of the tube is kept small, say below 10 mm. In alternate embodiments, larger diameters may be possible.

Similarly, the fluid within said container chamber 1400 may be comprised of nothing (a vacuum), a number of gases (including inert) and any number of liquids, including dielectric fluids. In this fashion, the heat transfer unit may allow the LED stick 300 that was limited to 0.8 W to transmit consume as much as 3.2 W. The pipe or container 1300 may be made of any number of materials (plastic, glass, etc.), including the same as those used in the encapsulation of the LED stick subassembly 300 described above.

The fluid within the container chamber 1400 naturally collect more heat from the LED crystal, since it does so from all sides of the LEDs, and the natural gradient thermal distribution transfers the heat to cooler areas of the chamber. In a regular structure of LEDs, heat is collected or removed only from one side, the one where the LED crystal is attached to the heat sink, with heat removal being blocked by silicone or similar substances on the other sides. In the applicant's, fluid collects heat from all sides of LED and transfers it to the larger area of presented by the outer side of pipe. Said pipe may be made from any optically clear substances, like, but not limited to heat conductive ceramic, crystals, glass, etc.

Referring to FIGS. 15-19, these illustrate an alternate embodiment of the invention, where various implementation and design methods are used to create an LED stick or candle 300 (whether clear 300, colored or encapsulated 1200) comprised of one LED die chip 104 per frame 302, each LED chip 104 being connected to its neighbors by a wire bond 404, and the lower extensions of the frames into fins 1602 acting as extended metal fins leaving the length of the LED stick 300.

Note the above means that the LED chips within the top of the bar may number from one to hundreds, as could be the combination of colors. In addition to LED chips, other semiconductors may be placed atop the bar, including other diodes, transistors, electro-static protection elements (resistors, etc.), resistors, capacitors and many other electronic components. This placement may be automated or manual, and connected together via traditional methods such as wire bonding, soldering, etc.

In one embodiment, insulation material 1702 is placed between the frames 302 and allow for an eutectic LED die 104 placement. This same insulation 1702 may be coated using silicon with a phosphor, allowing for the emitting of light 'around' the space between the frame 302 bases, as seen in the circular cross section 1802.

The user may elect the cross sectional shape 1804 of the plastic or other material covering the LED stick 300, such as a long bar covering all LED chips and parts of Cathode(s) and Anode(s). If needed, almost finished Lead Frame may be Phosphor coated, with silicone or other based Phosphor. It could be coated by using immersion, electrostatic coating and any other suitable methods. After finishing encapsulation and coating the lead frame goes to a cutting machine. That machine cuts off not needed anymore technological holders like holders, supports, bases, extra length of anode and cathodes, etc.

Figure 19:
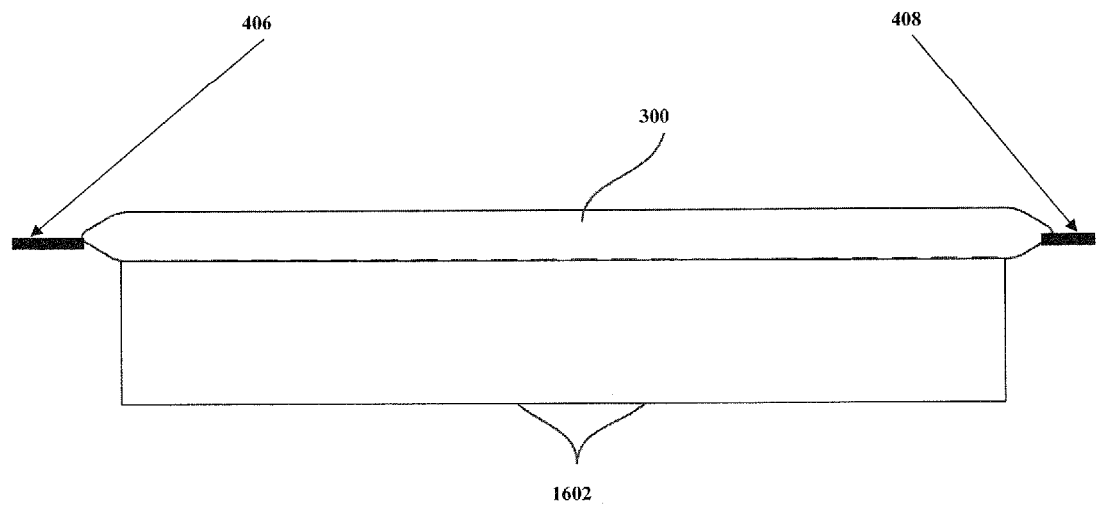
Figure 20:
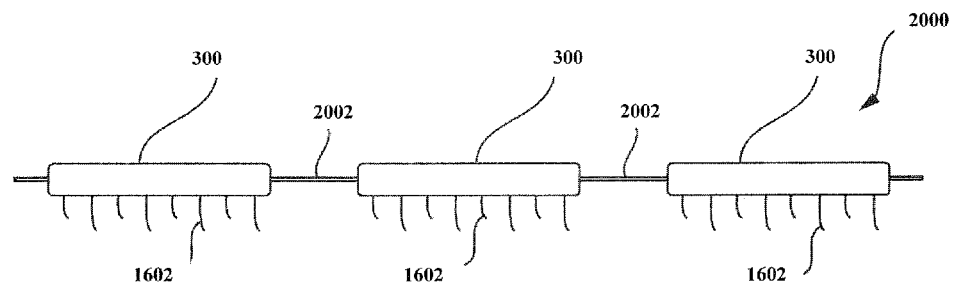
Figure 21:
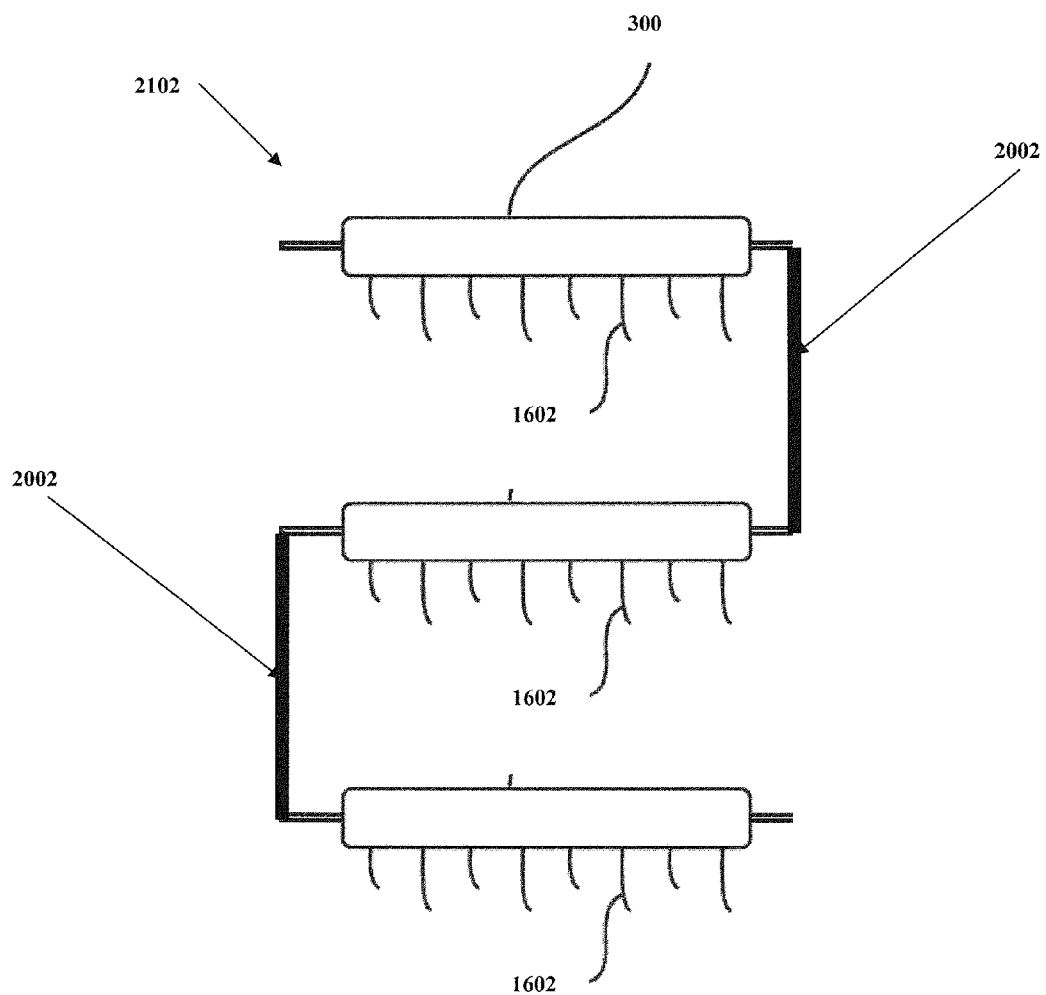

Referring to FIG. 19, we see how the complete LED stick 300 looks eerily like a candle (albeit with wicks at both ends). Power dissipation is accomplished in two ways, the encapsulation 1804 material warms and emits heat, and the lower extensions of the frame fins 1602 bring portions of the heat inside the enclosure 1804 to the outside, by acting as radiator fins for the heat.

In one embodiment, the encapsulating LED stick 300 plastic is defined as electrically conductive plastic. In an alternate embodiment, it is possible to use a polycarbonate. Polycarbonates (PC), known by the trademarked names Lexan, Makrolon, Makroclear and others, are a particular group of thermoplastic polymers. They are easily worked, molded, and thermoformed. Because of these properties, polycarbonates find many applications. Polycarbonates do not have a unique resin identification code.

Figure 22:
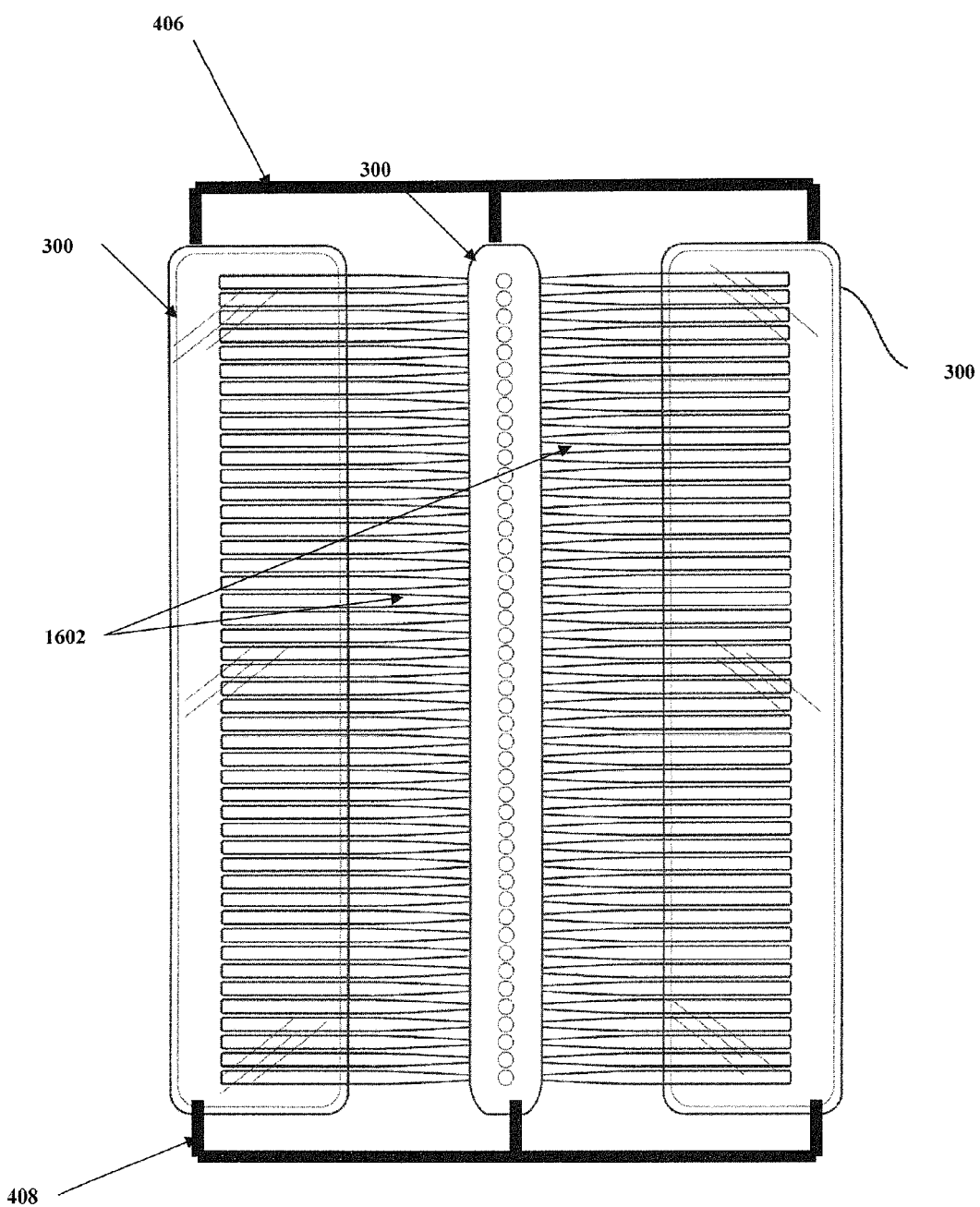
Figure 23:
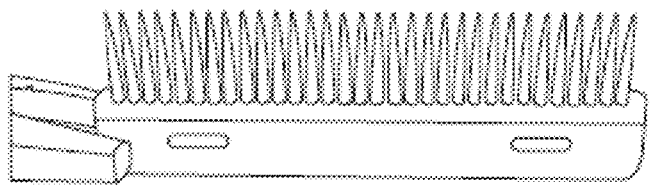

Concatenating (FIGS. 20-23) two or more 2000 of the LED stick units 300 while letting them connected to each other by an extended connector 2002 between candles 300, allows for a method in forming an assembly 2102 in which the candles form a candelabra in which the fins 1602 may be together or separate, yet cooperate geometrically between them to eliminate any shadows, while at the same time being compact enough to fit within a bulb, lamp or tube. Note that the connection to a power source may be accomplished serially 1202 or in parallel FIG. 22.

Figure 24:
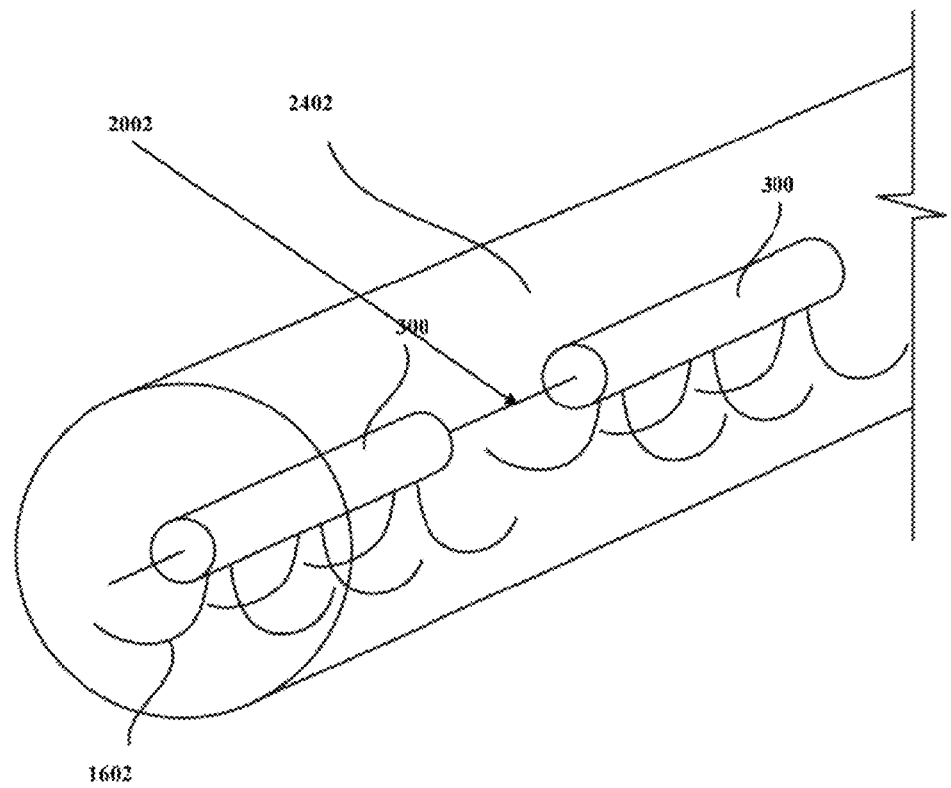
Figure 25:
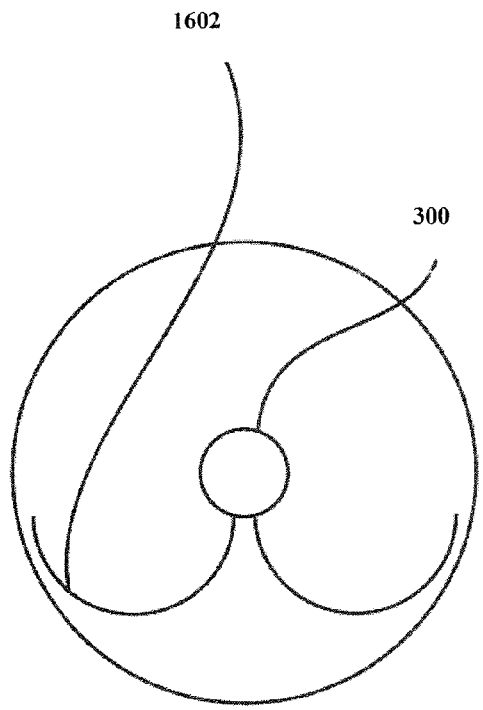
Figure 26:
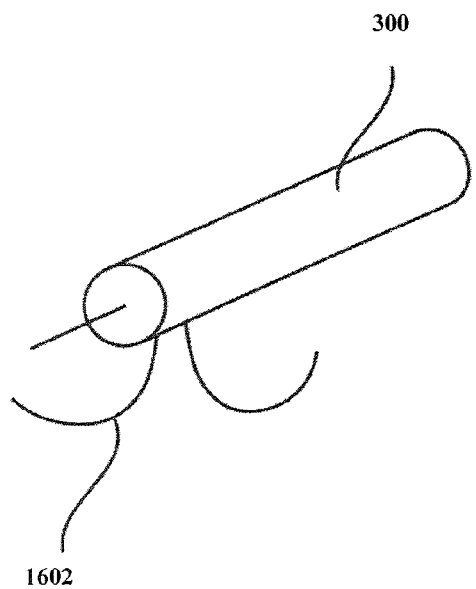
Figure 27:
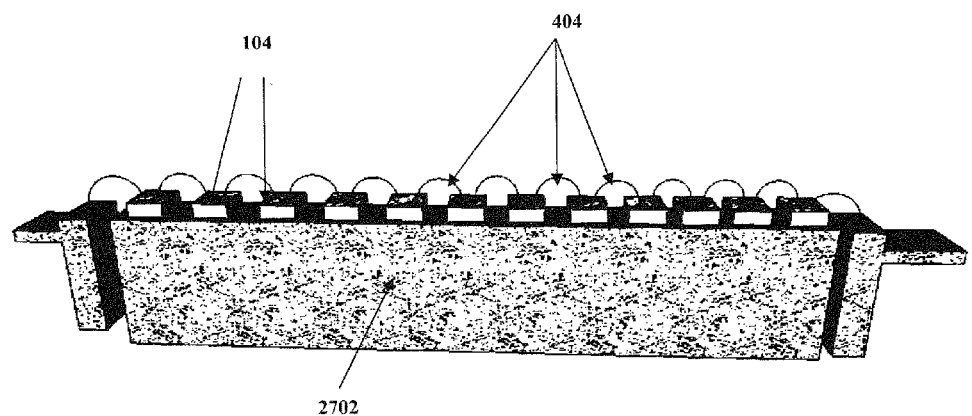
Figure 28:
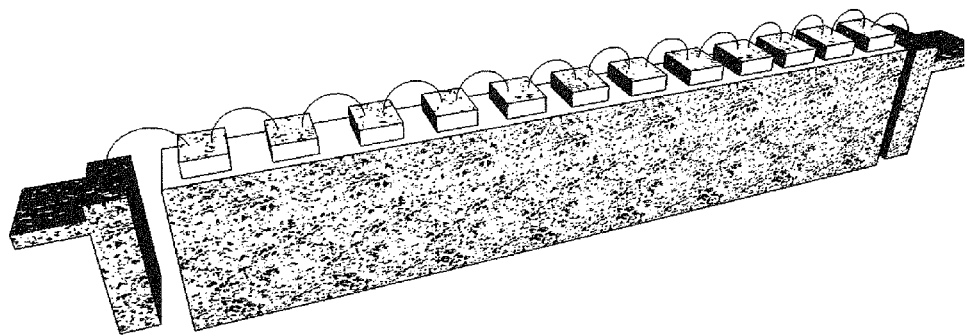
Figure 29:
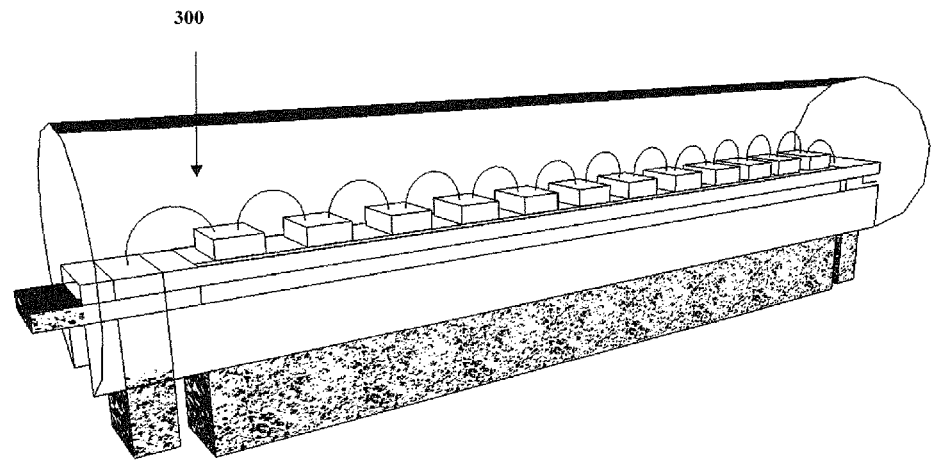
Figure 30:
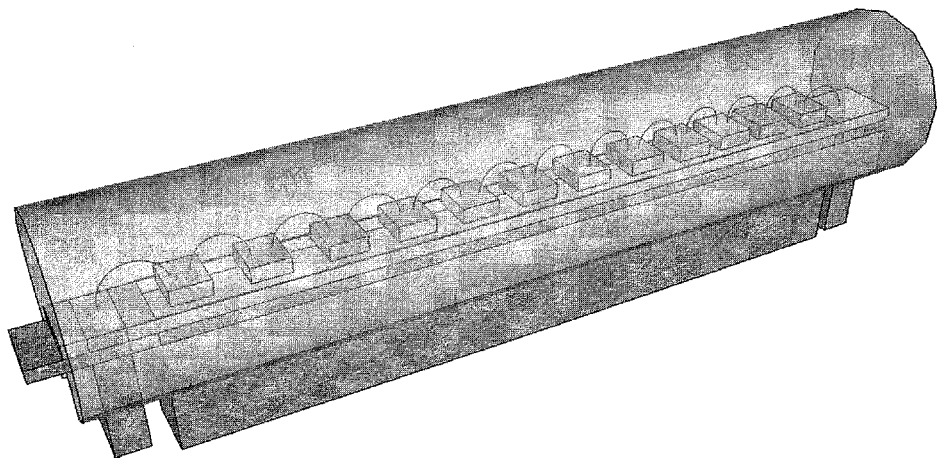

Referring to FIGS. 24-26, we show an alternate embodiment in which the fins 1602 are extended and bent, so that in addition to serving as a radiator, they mechanically support a train of candles 300 within a T-5, T-8 or any other suitable tubular housing 2402. In the case of both a bulb or the T-5/T-8 tube, there could be introduced into the container a gas mix. The electronics to drive the various LEDs may be housed within the bulb, or attached to the base of said bulb.

FIGS. 6-20 illustrate alternate embodiments of the above, including the various methods that may be used to create a candle having extended solid and continuous base cooling fins 602 created by leaving the length of the metal base upon which the LED 200 is mounted/formed fully extended.

Note the above means that the LED chips within the top of the bar may be hundreds, as could be the combination of colors. In addition to LED chips, other semiconductors may be placed atop the bar, including other diodes, transistors, electro-static protection elements (resistors, etc.), resistors, capacitors and many other electronic components. This placement may be automated or manual, and connected together via traditional methods such as wire bonding, soldering, etc.

Referring to FIGS. 27-31 we see an embodiment where the LED dies 104 are placed in a non-eutetic fashion, so that the complete base can be a solid piece of metal or other suitable heat transferring media, allowing the encapsulation to produce an LED stick 300 with superior heat transferring external fin 2702 outside the encapsulating media.

Figures 34, 35:
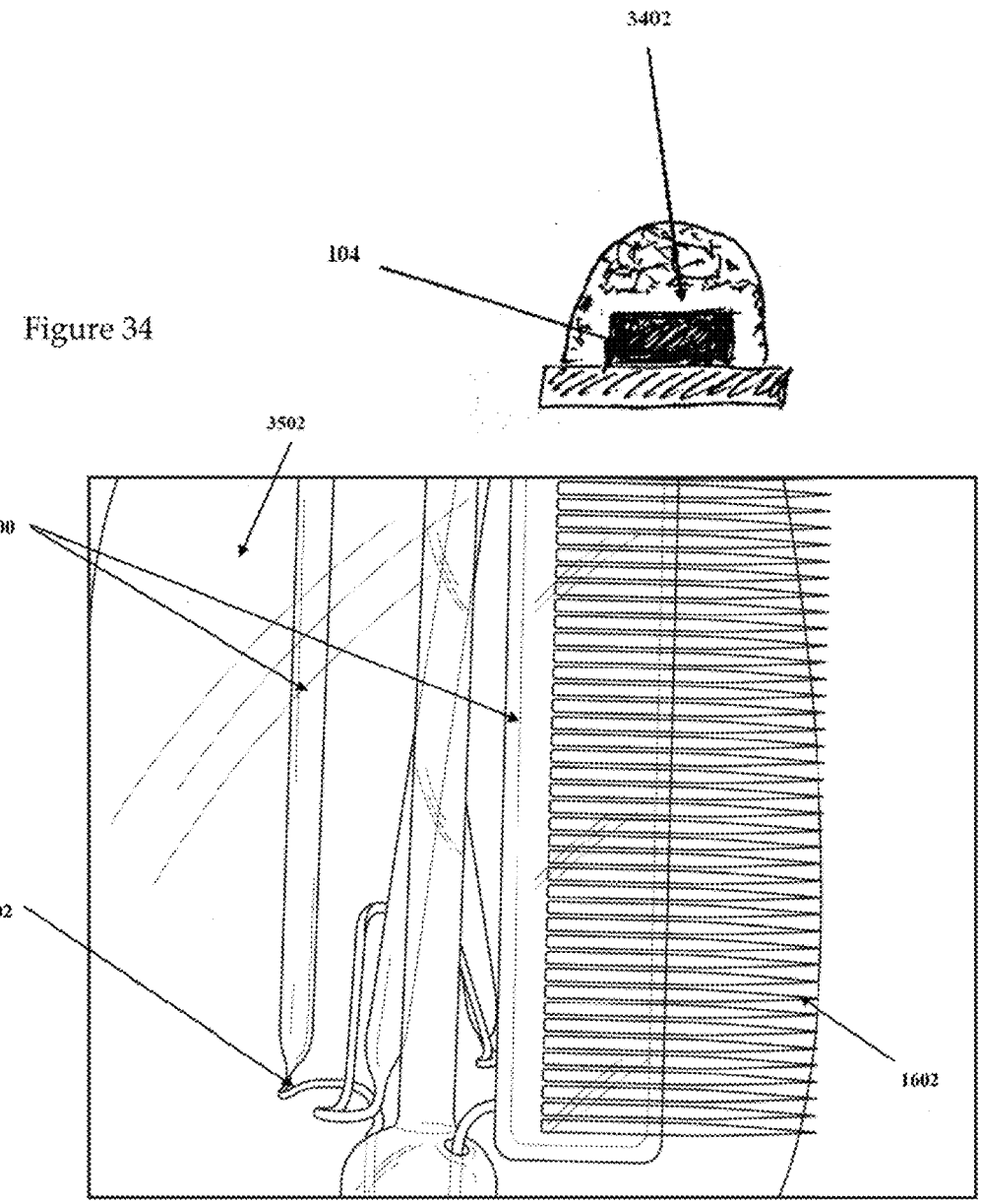

Referring to FIGS. 32-34, the coating of yellowing phosphor described above may be applied near the periphery of the encapsulation 3202, above the actual LED die area 3302 or directly above the LED die on a traditional package 3402.

EXAMPLE 1

An LED light emitting bar, pole, filament, or candle could have a size of bar that is plastic covered in length of 30 mm, diameter of 2.5 to 3.5 mm, having a size of bar with connectors of 38-40 mm. In such an example, the quantity of light chips 200 within a single candle could be 26 pcs, in the 465-475 nm, having a serial connection.

It could be mfd. using flip chip technology, having a working voltage of 70-90 Volts, with current up to 30 mA, with a pulse of up to 100 mA. The LED chip size(s) 10×18, 10×20, 10×23, 10×26 mm, depending on the pad size being used. Some additional LEDs could be 10×18 or 20×20 mm with ESP. Thickness of LED die sapphire substrate in the 200-430 micron (0.2-0.43 mm). Thicker may be better (say—0.43 mm) as a standard for sapphire wafer. Each chip seats on it's own pad—"leg", having no reflector on the pad.

Top attach, using an eutectic placement, wire bonding: Au or Al with Au plated—chipper. Wire bonding: could be done by 1 wire to LED die, or by 2 wires on same LED die "Leg" size of L 5.0×W 0.7×T 0.7 or L 5.0×W 0.5×T 0.5 mm. LED die "Leg" goes throughout of plastic for 3.0-4.0 mm.

Type of plastic (Epoxy) cover: LED compatible, phosphor compatible, no need for weather protection, bar will be insulated inside and protected Plastic (Epoxy): mixed with phosphor, molded over metal "legs" with LED dies Plastic (Epoxy). Especially shaped for better light output and distribution, cylindrical stars. Microscopic view: bar inside, single wire bonding, eutectic die attach, die thickness~10 mil In one embodiment, the system could be used as replacement for incandescent light bulbs filaments, since due to its shape it could also be used as replacement for "gas discharge line" in T8, T5 fluorescent tubes. There is no need for PCB (Printed Circuit Board), and the separated, independent heat sink for every LED die (chip) in a bar would provide one of the best heat dissipation ability for LED dies, due to the ratio of sizes between LED die and size of the heat sink.

Very low thermal resistance between LED die and heat sink, to ambient, due to eutectic bonding process. Very wide angle of light distribution, due to a shape of pad for die attach, of plastic (epoxy) lens. No needs for secondary optics, lens are molded at the same time of production. Possibility to make heat sink electrically insulated, by using different die attachment methods.

CONCLUSION

In concluding the detailed description, it should be noted that it would be obvious to those skilled in the art that many variations and modifications can be made to the preferred embodiment without substantially departing from the principles of the present invention. Also, such variations and modifications are intended to be included herein within the scope of the present invention as set forth in the appended claims. Further, in the claims hereafter, the structures, materials, acts and equivalents of all means or step-plus function elements are intended to include any structure, materials or acts for performing their cited functions.

It should be emphasized that the above-described embodiments of the present invention, particularly any "preferred embodiments" are merely possible examples of the implementations, merely set forth for a clear understanding of the principles of the invention. Any variations and modifications may be made to the above-described embodiments of the invention without departing substantially from the spirit of the principles of the invention. All such modifications and variations are intended to be included herein within the scope of the disclosure and present invention and protected by the following claims.

The present invention has been described in sufficient detail with a certain degree of particularity. The utilities thereof are appreciated by those skilled in the art. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

The invention claimed is:

1. An LED light package system comprising;
a plurality of LED die chips placed on one or more adjoining LED frames, each said LED die chip placed at the topmost surface of each said frame with no intervening frame portion located above the topmost height of adjoining LED die chips, wherein each said LED die chip is connected electrically to the LED die chip before and after said LED die chip, forming an electrical LED chain within said one or more adjoining LED frames;
wherein said one or more LED frames are encapsulated within a single solid enclosure, and access to said enclosure's interior is via an electrical connection through said encapsulation to the initial LED die chip located at said LED chain near end, and to a similar electrical connection through said enclosure connected to the final LED die chip located at said LED chain distal end, said electrical connections being suitable for connection to a power source; and
wherein each said encapsulated solid enclosure is surrounded by a heat-activated shrink wrap sleeve coated with the appropriate yellow phosphor material.

2. The LED package of claim 1, wherein;
said one or more LED frames are formed of metal.

3. The LED package of claim 2, wherein;
said LED light package is connected to one or more other LED light packages serially or in parallel to form an assembly of light sources.

4. The LED package of claim 3, wherein;
said assembly of light sources is enclosed within a lamp or bulb.

5. The LED package of claim 3, wherein;
said assembly of light sources is enclosed within a tube.

6. The LED package of claim 2 wherein;
each said LED frame has one or more metal portions that extends outside said encapsulation volume forming one or more fins.

7. The LED package of claim 5, wherein;
said assembly of light sources is enclosed within a lamp or bulb.

8. The LED package of claim 2, wherein;
said assembly of light sources is enclosed within a tube.

9. The LED package of claim 8, wherein;
said fins are shaped to provide mechanical support within said tube.

10. The LED package of claim 8 wherein;
said fins are shaped to provide mechanical support within said tube.

11. The LED package of claim 10 wherein;
one or more of said encapsulations are enclosed within a fluid-filled container.

12. The LED package of claim 1 wherein;
said one or more LED frames are formed of a sapphire or sapphire-like material.

13. The LED package of claim 11, wherein;
said LED light package is connected to one or more other LED light packages serially or in parallel to form an assembly of light sources.

14. The LED package of claim 12, wherein;
said assembly of light sources is enclosed within a lamp or bulb.

15. The LED package of claim 14 wherein;
one or more of said encapsulations are enclosed within a fluid-filled container.

16. A method for manufacturing an LED light source system, said method comprising;
placing a plurality of LED die chips on one or more adjoining LED frames, ensuring each said LED die chip is placed at the topmost surface of each said LED frame with no intervening frame portion located above the topmost height of adjoining LED die chips;
connecting each said LED die chip within said one or more LED frames electrically to the LED die chip before and after said LED die chip, forming an electrically linked LED chain;
encapsulating said one or more LED frames within a single solid enclosure, allowing an electrical connection through said encapsulation to the interior of said enclosure to connect to the initial LED die chip located at said LED chain near end, and to a similar electrical connection through said enclosure connected to the final LED package located at said LED chain distal end; and
wherein each said encapsulated solid enclosure is surrounded by a heat-activated shrink wrap sleeve coated with the appropriate yellow phosphor material.

17. A method for manufacturing an LED light source system, said method comprising;
placing a plurality of LED die chips along rows on an area wafer, ensuring each said LED die chip is placed at the topmost surface of said wafer with no intervening wafer portion located above the topmost height of adjoining LED die chips;
connecting each said LED die chip electrically to the LED die chip before and after said LED die chip within a particular row, forming an LED chain;
separating each individual row of LED die chips into an individual sliver;
encapsulating one or more said slivers within a single solid enclosure, allowing an electrical connection through said encapsulation to the interior of said enclosure to connect to the initial LED die chip located at said LED chain near end, and to a similar electrical connection through said enclosure connected to the final LED package located at said LED chain distal end; and wherein each said encapsulated solid enclosure is surrounded by a heat-activated shrink wrap sleeve coated with the appropriate yellow phosphor material.

18. The LED package of claim 2, wherein;
said LED die chips are attached in an eutectic fashion.

19. The LED package of claim 2, wherein;
said LED die chips are attached in a non-eutectic fashion.

\* \* \* \* \*